United States Patent [19]

Wittekoek et al.

[11] Patent Number: 4,655,594

[45] Date of Patent: Apr. 7, 1987

[54] DISPLACEMENT DEVICE, PARTICULARLY FOR THE PHOTOLITHOGRAPHIC TREATMENT OF A SUBSTRATE

[75] Inventors: Stefan Wittekoek; Adrianus G. Bouwer, both of Eindhoven, Netherlands

[73] Assignee: U.S. Philips Corporation, New York, N.Y.

[21] Appl. No.: 838,894

[22] Filed: Mar. 11, 1986

Related U.S. Application Data

[63] Continuation of Ser. No. 547,174, Oct. 31, 1983, abandoned.

[30] Foreign Application Priority Data

Nov. 17, 1982 [NL] Netherlands .......................... 8204450

[51] Int. Cl.[4] .......................... G01B 11/27; G01B 9/02
[52] U.S. Cl. ..................................... 356/363; 356/244; 356/399
[58] Field of Search ........ 356/363, 358, 244, 399–401; 355/72, 53; 269/55, 900; 33/18.1, 18.2, 32.3

[56] References Cited

U.S. PATENT DOCUMENTS

| | | | |
|---|---|---|---|
| 3,550,276 | 12/1970 | Kramer et al. | 33/18.1 |
| 3,622,244 | 11/1971 | Chitayat | 356/363 |
| 3,884,580 | 5/1975 | Webster et al. | 356/358 |
| 3,941,480 | 3/1976 | Webster et al. | 356/358 |
| 4,226,526 | 10/1980 | Spence-Bate et al. | 355/53 |
| 4,311,390 | 1/1982 | Phillips | 356/358 |
| 4,345,836 | 8/1982 | Phillips | 355/53 |
| 4,464,030 | 8/1984 | Gale et al. | 355/53 X |

FOREIGN PATENT DOCUMENTS 1953712 10/1968 Fed. Rep. of Germany ...... 356/363

*Primary Examiner*—Vincent P. McGraw
*Attorney, Agent, or Firm*—Robert T. Mayer

[57] ABSTRACT

A displacement device, particularly useful in an apparatus for the photolithographic treatment of a substrate, is provided with a holder placed on a carriage mechanism being acted upon by driving members for imparting translational and rotary movements to the holder. The carriage is constituted by a lower carriage part and an upper carriage part, each of which has a flat surface facing each other. Three linear driving members, each having a housing and a driving element projecting from both ends of the housing, and axially moving with respect to the housing, act upon the carriage. The housing of the first driving member is connected to an upper carriage part, while the driving elements of the second and third driving members are coupled to the lower carriage part with the second and third driving members respectively being connected to the first driving member in an arrangement in the shape of an H.

12 Claims, 3 Drawing Figures

DISPLACEMENT DEVICE, PARTICULARLY FOR THE PHOTOLITHOGRAPHIC TREATMENT OF A SUBSTRATE

This is a continuation of application Ser. No. 547,174, filed Oct. 31, 1983, now abandoned.

The invention relates to a displacement device, particularly for use in an apparatus for the photolithographic treatment of a substrate, which device is provided with a holder placed on a carriage mechanism acted upon by driving members for imparting translational movements and a rotary movement to the holder.

In many cases, the necessity arises to adjust articles with respect to each other. The invention relates to a displacement device for providing a very accurate adjustment. An important field of use is the manufacture of semiconductor devices. For example, in the manufacture of masks by means of a so-called step and repeat camera, an extremely accurate adjustment is of great importance. Also when a pattern is repeatedly imaged on a sensitive layer on a substrate, as with optical and electron beam generators, this high degree of accuracy is required. Of course, an accurately operating displacement device may also be used in other fields.

An example of a displacement device for use in the manufacture of semiconductor devices is disclosed in DE 19 53 712. In this case, a co-ordinate carriage system is used in which an X-carriage is axially movable on a Y-carriage, while a workpiece support is axially movable on the X-carriage. Means are further provided for causing the workpiece to perform a small translation and rotation with respect to the workpiece support so that a fine adjustment is obtained.

In this known arrangement of X-Y carriages on each other, a very accurate guiding between the two carriage parts and between the upper carriage and the workpiece support has to be provided; a small amount of clearance in the guiding may lead to inadmissible deviations in the adjustment. A displacement of the workpiece support with respect to the upper carriage results in that the forces produced in the guiding between the X- and Y-carriages and caused by the acceleration of the mass of the upper carriage and of the workpiece support vary, which may adversely affect the possibility of adjustment. The coarse adjustment and the fine adjustment in the known device are effected by means of two different systems, which results in a complicated construction and provides a limitation in the speed of adjustment. The fine adjustment is obtained by means of adjustment elements which only have a strongly limited stroke, which renders the positioning more difficult and nevertheless causes stringent requirements to be imposed on the coarse adjustment.

The invention has for its object to provide a displacement device with which a high degree of adjustment accuracy can be obtained with a very short adjustment time, while no separate coarse and fine adjustment members are required and the construction is simple; and, when no use is made of a co-ordinate carriage system with separate X- and Y-carriages, it can be achieved that the forces produced between the carriage parts are not unfavourably influenced upon displacement of a workpiece support, while a stable operation is obtained by a favourable distribution of the forces produced during the displacement.

According to the invention, this object is attained in that the carriage is constituted by a lower support part and an upper carriage part, which carriage parts each have a flat surface facing each other, and three linear driving members acting upon the carriage, which support and driving members each have a housing and a driving element which projects on both sides from the housing and which is axially movable with respect to the housing, in that the housing of the first driving member is connected to the upper carriage part, while the driving elements of the second and the third driving members are coupled with the lower support part, and in that the driving elements of the first driving member are connected to the housing of the second and the third driving members, respectively, with the driving members being arranged in the shape of an H.

The carriage is no longer constituted by a coordinate carriage system, in which accurate guidings have to be present between the parts, but by two parts which are arbitrarily movable with respect to each other in a flat plane. An accurate position determination can be obtained by means of a measuring system. The arrangement of the driving members permits obtaining a rapid and accurate adjustment. Inter alia due to the fact that the driving members are located in one plane and in the shape of an H, a favourable distribution of the forces acting upon the carriage is obtained.

The invention will be described with reference to an embodiment shown diagrammatically in the drawing.

Figure 1:
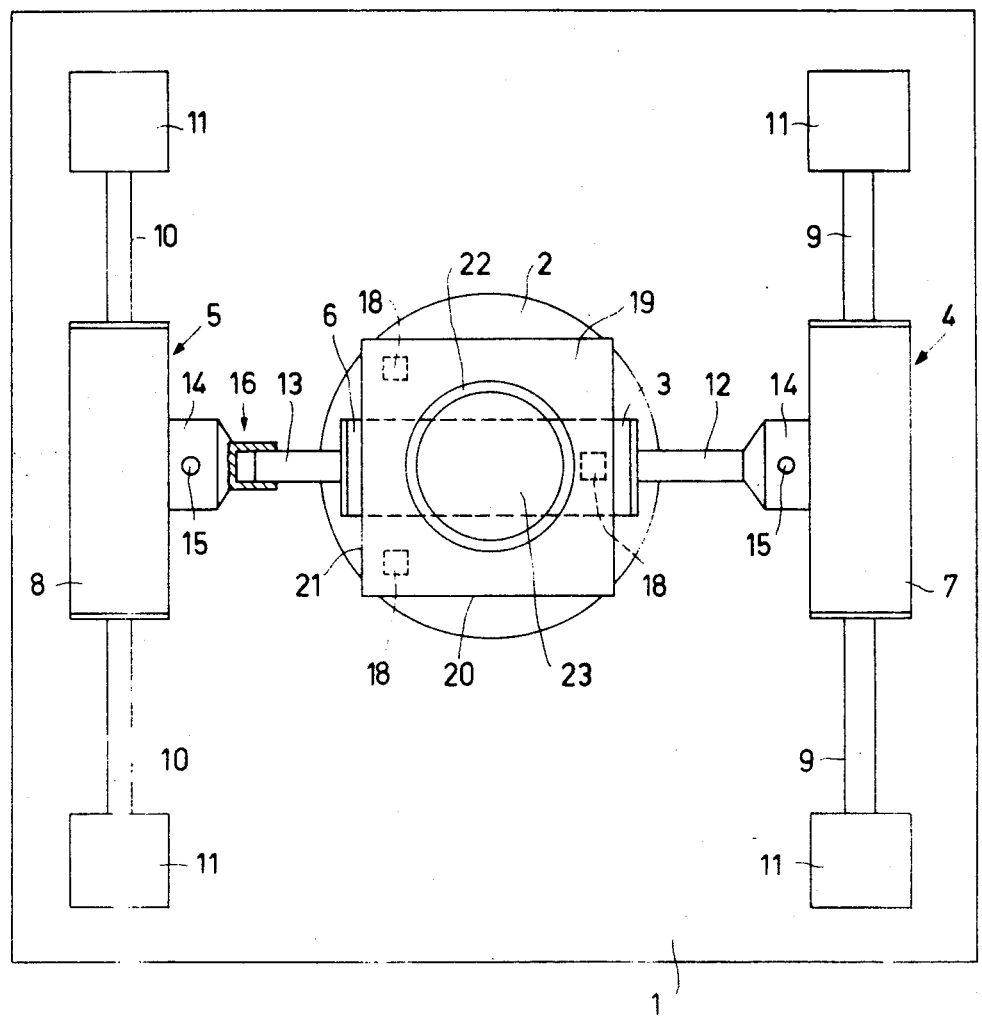
FIG. 1 is a schematic representation of the plan view of a device according to the invention.
Figure 2:
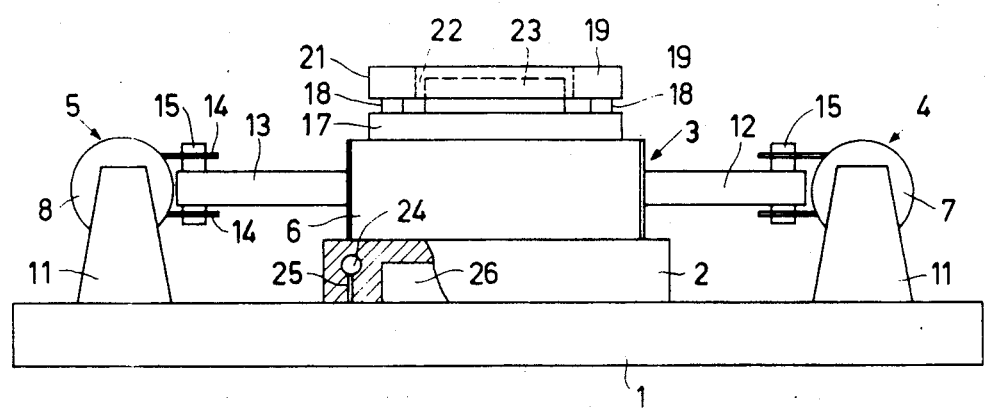
FIG. 2 is a side elevation, partly in sectional view, of the device.

FIGS. 1 and 2 show diagrammatically an embodiment of the displacement device. The device comprises a carriage with the lower support part 1 consisting of a granite plate and the upper carriage part 2 consisting of an air sole. The surfaces of the support and carriage parts facing each other are flat. An air bearing provided by means of the air sole, ensures that the relative movement of the support and carriage parts is effected substantially without friction. Although an air bearing is to be preferred, it is not necessary for the satisfactory operation of the device; lubrication with oil between the support and carriage parts, for example, is also possible.

The device comprises three driving members 3,4,5 which are arranged in the shape of an H. The driving members shown in the drawing are hydraulic linear motors, which are preferably hydrostatically journalled. The control means for the hydraulic motors are not shown for the sake of clarity. The housing 6 of the hydraulic motor 3 ensuring movement in the X-direction of the upper carriage part 2 with respect to the support part 1 is secured on the carriage part 2 with the aid of means not shown, but such as, for example, with the aid of bolt-nut joints. The movement in the Y-direction is ensured by the driving members 4 and 5 which can also cause a rotary movement of the carriage part 2. At both ends of the housing 7 and 8, respectively, an axially movable driving element 9 and 10, respectively, projects outwardly. The driving elements 9 and 10 are shafts which are connected to a plunger present in the housing 7 or 8 of the driving member. The ends of the shafts 9 and 10 are fixedly secured to the support part 1 with the aid of connection blocks 11. The driving elements 12, 13 of the driving member 3 for the X-direction are pivotally secured to the housings 7 and 8, respectively, of the driving members 4,5 for the Y-direction. For this purpose, for example, two plates 14 located one above the other are secured to the housings 7 and 8, which plates are adapted to receive a hinge shaft 15, which hinge shafts are also passed through the ends of the driving elements 12 and 13. In order to bridge the distance between the two hinge shafts 15 upon angular rotation of the carriage part 2, the driving element 13 is constructed as a slide shaft, as is diagrammatically shown at 16 in FIG. 1.

Preferably, a plate 17 of a material having a low thermal coefficient of expansion is secured on the housing 6 of the driving member 3. Three supports 18 are provided on this plate. A reference member 19 is supported by these supports. The reference member, which preferably also consists of a material having a low coefficient of expansion, has two orthogonal outer surfaces 20 and 21, which have the form of mirrors. The position of the carriage part 2 with respect to the support part 1 can be determined with great accuracy, i.e. within 0.1 μm, by means of these mirror surfaces in co-operation with a laser-interferometer assembly. A recess 22 is provided in the reference member 19. A holder 23 for a workpiece, for example for a substrate, in which semiconductor elements are to be formed, is arranged on the plate 17. The upper surface of the holder 23 is the carrying surface for the substrate. This upper surface is chosen so with respect to the mirror surfaces 20 and 21 that it substantially coincides with the plane in which the light beams of the laser-interferometer assembly are located. By arranging the substrate just at this level, optical errors in the position detection are avoided that may occur due to lack of planeness and consequently tilting of the carriage part 2 with respect to the support part 1.

The substrate is held by the holder 23. This holding effect is preferably obtained by means of subatmospheric pressure in a manner known per se and not shown here. FIG. 2 on the contrary shows diagrammatically the construction of an air sole. The upper carriage part is provided with an inlet 24 for air under pressure, from which restrictions 25 lead to the flat surface facing the first support part 1. The air under pressure flowing out of the restrictions provides an aerostatic bearing between the support and carriage parts 1 and 2. Further, the carriage part 2 is provided with a space 26 in which a subatmospheric pressure can be produced in order to provide in this manner a desired preliminary stress for the aerostatic bearing.

If liquid is supplied to the hydraulic motor of the driving member 3, the housing 6 and hence the carriage 2 in FIG. 1 will move in X-direction, to the right or to the left. A movement in the Y-direction of the carriage is obtained by supplying liquid simultaneously to the motors of the driving members 4 and 5 so that the housings 7 and 8 move in the same direction. A rotation of the carriage 2 is obtained by movement of the driving members 4 and 5 in opposite directions.

The motors of the driving members 3, 4 and 5 are located at the same level above the support and carriage parts 1 and 2. This is favourable for the forces which cause the adjustment of the carriage 1,2. The H arrangement of the motors of the driving members 3, 4 and 5 ensures that the carriage can be adjusted in a simple and rapid manner both as to translation and as to rotation.

In the Figures, hydraulic linear motors are shown. However, electric linear motors may also be used. Since in linear electric motors there may be a certain amount of clearance between housing and driving elements, it is then not necessary to couple the X-motor pivotally to the two Y-motors, but this joint may alternatively be rigid.

Figure 3:
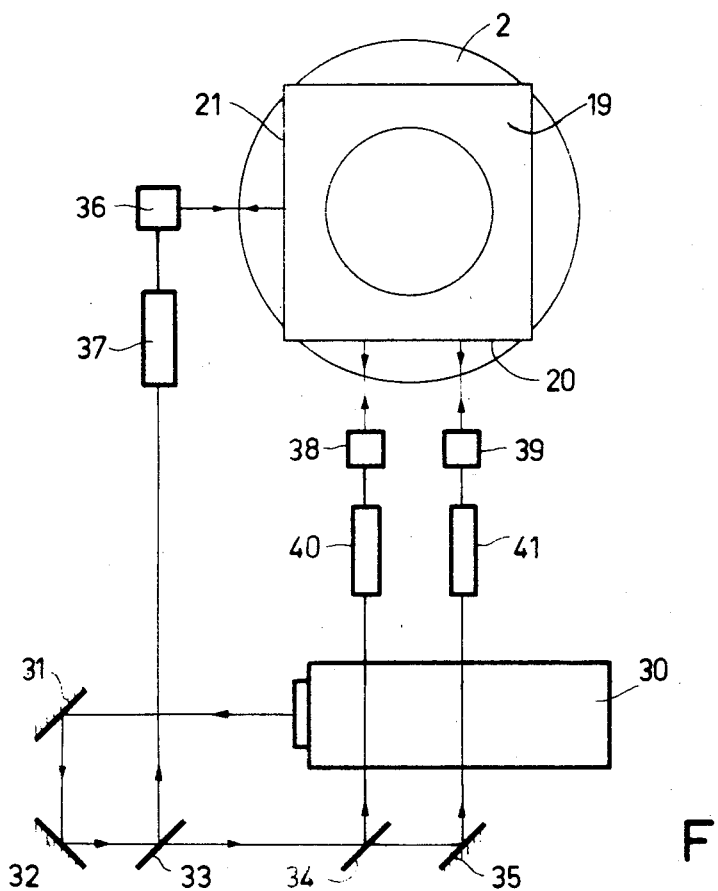
FIG. 3 is a schematic representation of the laser-interferometer assembly for adjusting the position.

FIG. 3 shows very diagrammatically the means with the aid of which the position of the carriage is measured with great accuracy and the motors for adjusting the desired position of the carriage are controlled with this measurement result. Only the elements strictly necessary for the measurement are shown.

A laser 30 emits light which is guided through inverter mirrors 31,32 to semi-transparent mirrors 33 and 34. The mirror 33, for example, transmits $\frac{2}{3}$ of the light and directs $\frac{1}{3}$ of the light through an interferometer 36 to the mirror surface 21 of the reference member 19. The light reflected from the mirror surface 21 is intercepted by the interferometer and the light beam processed in the interferometer is passed to a receiver 37 which emits an electric signal to electronic processing means not shown. In these processing means, the position of the X-direction of the carriage measured by the interferometer 36 is compared with a desired position. A difference signal, if any, is utilized to control the linear motor of the driving member 3 until the desired X-position is reached.

In a similar manner, the Y-position is determined with two light beams being used and interferometers 38 and 39 providing a position indication. Receivers 40 and 41 again emit an electric signal to the processing means. With the two values of Y, both the occupied Y-position and the angle at which the reference member 19 is arranged can be determined. A difference signal, if any, with the desired signal is utilized to control the motors of the driving members 4 and 5.

What is claimed is:

1. A displacement device for use in an apparatus for photolithographic treatment of a substrate, said device comprising a lower support part and an upper carriage part, said parts having flat surfaces facing each other, a first linear driving member having a first housing and first driving element means with two ends, said upper carriage part being supported on said first housing, said first housing being movable with respect to said first driving element means and with respect to said lower support part in one axis, thereby rendering said upper carriage part movable with respect to said lower support part along said axis, a second linear driving member having a second housing and second driving element means, a third linear driving member having a third housing and third driving element means, said second and third housings being movable with respect to said second and third driving element means respectively and with respect to said lower support part in an axis perpendicular to said one axis, said second and third housings being movable parallel to each other, and connecting means connecting said ends of said first driving element means to said second and third housings and rendering said first housing and said upper carriage movable along said perpendicular axis and rotatable with respect to said lower support part.

2. A device according to claim 1, wherein each of said linear driving members includes a hydraulic linear motor, and a different end of said first driving element means is pivotally connected to each of said second and third housings, and wherein one end of said first driving element means comprises a slide shaft.

3. A device according to claim 1, wherein said linear driving members include linear electrical motors.

4. A device according to claim 3, wherein said upper carriage part includes a plurality of restrictions merging into said flat surface facing said lower support part, said restrictions joining a source of excess pressure in said lower support part to form an aerostatic bearing between said lower and said upper carriage parts, said upper carriage part including a chamber adjoining said lower support part, said chamber being connected to subatmospheric pressure to obtain a preliminary stress of said aerostatic bearing.

5. A device according to claim 4, wherein two orthogonal mirror surfaces are present on said upper carriage part, said mirror surfaces comprising two upright sides of a reference member, and wherein control means are provided for controlling the position of said reference member by said driving members, said control means including a laser-interferometer assembly using laser light beams for reflection by said mirror surfaces.

6. A device according to claim 5, wherein a holder is located in said reference member, said holder including a carrying surface for an article, said carrying surface substantially coinciding with the plane in which said light beams are located in reflection from said mirror surfaces in order to determine the position of said holder.

7. A device according to claim 3, wherein said upper carriage part includes a plurality of restrictions merging into said flat surface facing said lower support part, said restrictions joining a source of excess pressure in said lower support part to form an aerostatic bearing between said lower and said upper parts, said upper carriage part incuding a chamber adjoining said lower support part, said chamber being connected to subatmospheric pressure to obtain a preliminary stress of said aerostatic bearing.

8. A device according to claim 7, wherein two orthogonal mirror surfaces are present on said upper carriage part, said mirror surfaces comprising two upright sides of a reference member, and wherein control means are provided for controlling the position of said reference member by said driving members, said control means including a laser-interferometer assembly using laser light beams for reflection by said mirror surfaces.

9. A device according to claim 8, wherein a holder is located in said reference member, said holder including a carrying surface for an article, said carrying surface substantially coinciding with the plane in which said light beams are located in reflection from said mirror surfaces in order to determine the position of said holder.

10. A device according to claim 3, wherein said upper carriage part includes a plurality of restrictions merging into said flat surface facing said lower support part, said restrictions joining a source of excess pressure in said lower support part to form an aerostatic bearing between said lower and said upper parts, said upper carriage part including a chamber adjoining said lower support part, said chamber being connected to subatmospheric pressure to obtain a preliminary stress of said aerostatic bearing.

11. A device according to claim 10, wherein two orthogonal mirror surfaces are present on said upper carriage part, said mirror surfaces comprising two upright sides of a reference member, and wherein control means are provided for controlling the position of said reference member by said driving members, said control means including a laser-interferometer assembly using laser light beams for reflection by said mirror surfaces.

12. A device according to claim 11, wherein a holder is located in said reference member, said holder including a carrying surface for an article, said carrying surface substantially coinciding with the plane in which said light beams are located in reflection from said mirror surfaces in order to determine the position of said holder.

* * * * *

UNITED STATES PATENT AND TRADEMARK OFFICE
CERTIFICATE OF CORRECTION

PATENT NO. : 4,655,594
DATED : April 7, 1987
INVENTOR(S) : Stefan Wittekoek et al It is certified that error appears in the above-identified patent and that said Letters Patent is hereby corrected as shown below:

Claim 7, line 1  change "claim 3," to --claim 2,--

Signed and Sealed this

Twenty-third Day of May, 1989

Attest:

DONALD J. QUIGG

Attesting Officer

Commissioner of Patents and Trademarks